(12) United States Patent
Pala et al.

(10) Patent No.: US 12,283,482 B2
(45) Date of Patent: Apr. 22, 2025

(54) THIN WAFER PROCESS FOR IMPROVED CRYSTAL UTILIZATION OF WIDE BANDGAP DEVICES

(71) Applicant: MONOLITHIC POWER SYSTEMS, INC., San Jose, CA (US)

(72) Inventors: Vipindas Pala, San Jose, CA (US); Sudarsan Uppili, Portland, OR (US)

(73) Assignee: Monolithic Power Systems, Inc., San Jose, CA (US)

( * ) Notice: Subject to any disclaimer, the term of this patent is extended or adjusted under 35 U.S.C. 154(b) by 696 days.

(21) Appl. No.: 17/701,088

(22) Filed: Mar. 22, 2022

(65) Prior Publication Data

US 2022/0336215 A1     Oct. 20, 2022

Related U.S. Application Data

(60) Provisional application No. 63/175,477, filed on Apr. 15, 2021.

(51) Int. Cl.
| | |
|---|---|
| H01L 21/02 | (2006.01) |
| H10D 12/01 | (2025.01) |
| H10D 30/01 | (2025.01) |
| H10D 62/832 | (2025.01) |

(52) U.S. Cl.
CPC .. H01L 21/02378 (2013.01); H01L 21/02529 (2013.01); H10D 12/031 (2025.01); H10D 62/8325 (2025.01); H10D 30/025 (2025.01)

(58) Field of Classification Search
CPC ......... H01L 21/02378; H01L 21/02529; H01L 2221/68318; H01L 2221/68304; H01L 2221/6835; H01L 21/6835; H10D 12/031; H10D 62/8325; H10D 30/025; H10D 30/635

See application file for complete search history.

(56) References Cited

U.S. PATENT DOCUMENTS

| | | | |
|---|---|---|---|
| 6,419,742 B1 * | 7/2002 | Kirk | C30B 29/48 438/763 |
| 9,876,081 B2 * | 1/2018 | Meyer | H01L 21/32135 |
| 11,088,688 B2 | 8/2021 | Pala | |
| 2003/0015728 A1 * | 1/2003 | Bosco | H10F 71/1276 257/E27.012 |
| 2003/0056718 A1 * | 3/2003 | Kawahara | C30B 29/36 117/84 |
| 2011/0031504 A1 * | 2/2011 | Quick | H01L 23/3738 257/77 |
| 2011/0169050 A1 * | 7/2011 | Mishra | H10D 30/66 257/E29.081 |
| 2013/0247965 A1 * | 9/2013 | Swanson | H10F 10/14 257/E31.13 |

(Continued)

*Primary Examiner* — John P. Dulka
(74) *Attorney, Agent, or Firm* — Beyer Law Group LLP

(57) ABSTRACT

A method of fabricating a wide bandgap device includes providing a thin native substrate. An epitaxial layer is grown on a surface of the native substrate. After growing the epitaxial layer, a handle substrate is attached to the opposite surface of the native substrate by way of an interface layer. With the handle substrate providing mechanical support, wide bandgap devices are fabricated in the epitaxial layer using a low-temperature fabrication process. The handle substrate is detached from the native substrate after fabrication of the wide bandgap devices.

20 Claims, 4 Drawing Sheets

(56) References Cited

U.S. PATENT DOCUMENTS

| | | | |
|---|---|---|---|
| 2015/0021624 A1* | 1/2015 | Meyer | H10D 62/8325 257/77 |
| 2015/0214040 A1* | 7/2015 | Celler | H10D 86/0214 438/459 |
| 2016/0189954 A1* | 6/2016 | Kong | H01L 21/78 438/479 |
| 2018/0005827 A1* | 1/2018 | Odnoblyudov | H01L 21/0262 |
| 2020/0135866 A1* | 4/2020 | Linthicum | H01L 21/02381 |
| 2020/0259489 A1* | 8/2020 | Pala | H10D 30/475 |
| 2021/0265484 A1* | 8/2021 | Schulze | H01L 21/0262 |
| 2021/0375680 A1* | 12/2021 | Anderson | H01L 21/02002 |
| 2022/0415653 A1* | 12/2022 | Biard | C23C 16/325 |

\* cited by examiner

THIN WAFER PROCESS FOR IMPROVED CRYSTAL UTILIZATION OF WIDE BANDGAP DEVICES

CROSS-REFERENCE TO RELATED APPLICATION

This application claims the benefit of U.S. Provisional Application No. 63/175,477, filed on Apr. 15, 2021, which is incorporated herein by reference in its entirety.

TECHNICAL FIELD

The present disclosure is directed to wide bandgap devices.

BACKGROUND

Silicon carbide (SiC), gallium nitride (GaN), aluminum nitride (AlN), and diamond are examples of wide bandgap materials. As their name indicates, wide bandgap materials have a larger bandgap relative to conventional semiconductors. Whereas conventional semiconductors, such as silicon, has a bandgap in the range of 1-1.5 electron volt (eV), wide bandgap materials have a bandgap in the range above 2 eV. The larger bandgap allows transistors and other electronic devices made of wide bandgap materials to operate at higher voltages, temperatures, and frequencies.

BRIEF SUMMARY

In one embodiment, a method of fabricating a wide bandgap device includes providing a thin native substrate (e.g., silicon carbide). An epitaxial layer is grown on a surface of the native substrate. After growing the epitaxial layer, a handle substrate (e.g., silicon) is attached to the opposite surface of the native substrate by way of an interface layer (e.g., $SiO_2$). With the handle substrate providing mechanical support, wide bandgap devices are fabricated on the epitaxial layer using a low-temperature fabrication process. The handle substrate is detached from the native substrate after fabrication of the wide bandgap devices.

In one embodiment, the wide bandgap device is a wide bandgap vertical power metal-oxide-semiconductor field-effect transistor (MOSFET).

In one embodiment, the low-temperature fabrication process has a thermal budget that does not exceed 1300° C.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Because of their larger bandgap compared to conventional semiconductors, wide bandgap materials are ideal for use in power devices, such as power transistors. Vertical wide-bandgap power devices are typically fabricated on native substrates, e.g., silicon carbide power device on a silicon carbide substrate (SiC-on-SiC), gallium nitride power device on a gallium nitride substrate (GaN-on-GaN), etc. A major drawback of wide bandgap power devices is native substrate cost, which accounts for the largest fraction of device cost. For example, a native substrate of silicon carbide is approximately 40 times more expensive than silicon substrates.

The high impact of substrates on device cost has led wide bandgap substrate vendors to manufacture power devices and power modules. This results in large cost margin pressure on competitors and innovators, such as on startup companies with breakthrough device technologies that are not at scale, and also on companies that have a fabless business model or do not have the requisite capital. Given the relative infancy of SiC-on-SiC and GaN-on-GaN device technologies (with a 20-plus year roadmap for both), it is critical to introduce technologies that accelerate commoditization of native substrates.

The substrate serves two primary functions in vertical power devices. First, the bulk of the substrate provides mechanical support during device fabrication. Second, the surface of the substrate provides a template for growing a single-crystal epitaxial layer. After the epitaxial layer is grown, the function of the substrate is primarily mechanical in that the wafer needs to have a minimum thickness be able to withstand the device fabrication process without breaking.

Figure 1:
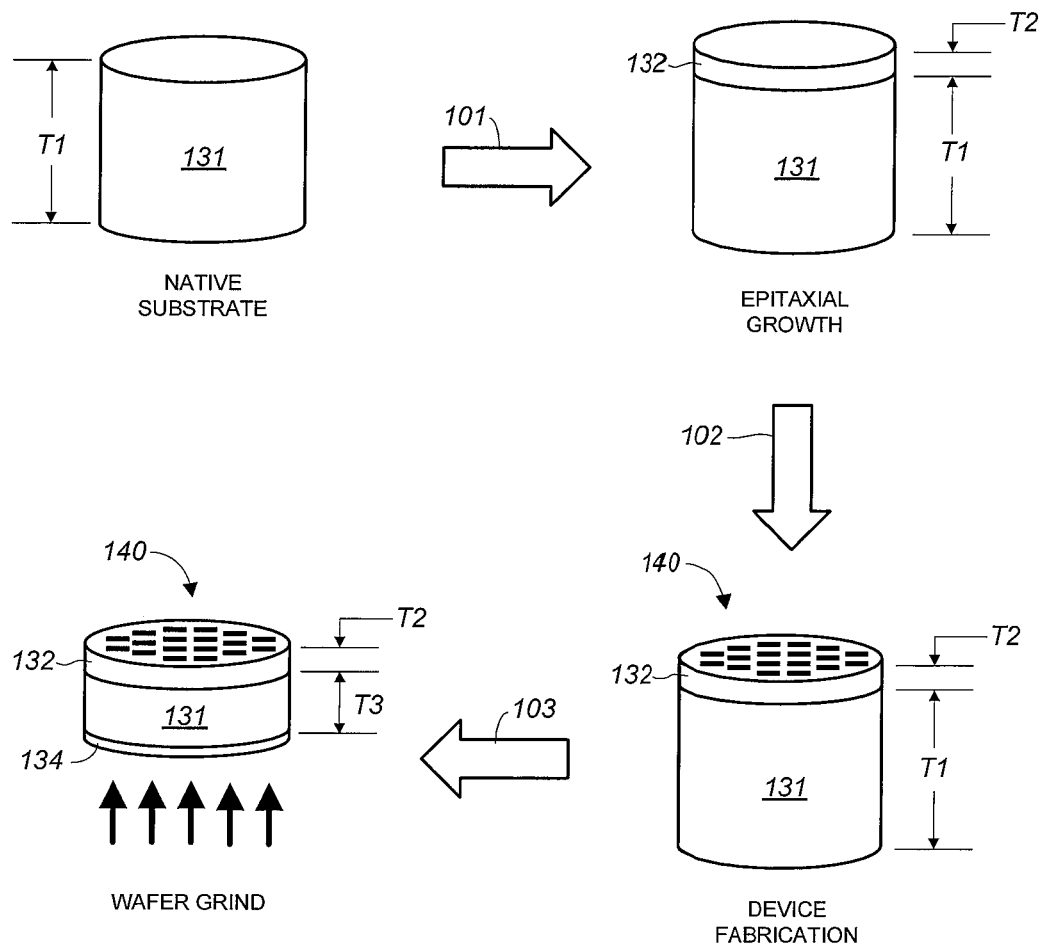
FIG. 1 is a graphical diagram that illustrates an example conventional method of fabricating a wide bandgap device.

FIG. 1 is a graphical diagram that illustrates an example conventional method of fabricating a wide bandgap device. It is to be noted that FIG. 1 and other figures in the present disclosure are not drawn to scale.

In the example of FIG. 1, the power device is a 1200V silicon carbide MOSFET. The fabrication of the silicon carbide MOSFET begins with a 4H-SiC native substrate 131 that has a starting thickness T1 of 350 µm. An epitaxial growth process grows a single-crystal epitaxial layer 132 with a thickness T2 of 10 µm on the surface of the native substrate 131 (see arrow 101). A plurality of MOSFETs 140 are fabricated in the epitaxial layer 132 (see arrow 102). After device fabrication, the bottom portion of the native substrate 131 is grounded to a thickness T3 of 100 µm (see arrow 103). A drain electrode layer 134 is thereafter formed on the bottom surface of the native substrate 131.

In the example of FIG. 1, the functionality and performance of the device are supported by the top approximately 15 μm thickness of the wafer, i.e., by the epitaxial layer 132 and some portion of the native substrate 131. The rest is ground away to the extent possible after device fabrication to minimize the series resistance on the vertical current path. In other words, greater than 95% of high-quality silicon carbide crystal, which accounts for approximately 50% of final wafer cost, is unexploited for its electronic properties and is thus essentially wasted.

Figure 2:
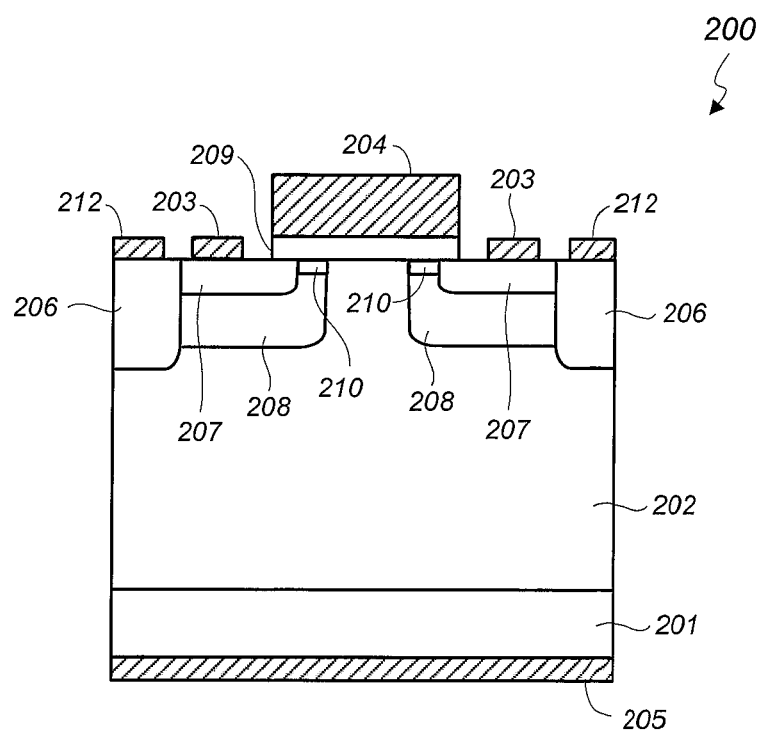
FIG. 2 is a cross-sectional view of a wide bandgap device that may be fabricated in accordance with an embodiment of the present invention.

Referring now to FIG. 2, there is shown a cross-sectional view of a wide bandgap device that may be fabricated in accordance with an embodiment of the present invention. In the example of FIG. 2, the wide bandgap device is a silicon carbide MOSFET 200, which is also referred to herein as the transistor 200.

In the example of FIG. 2, the transistor 200 comprises a gate electrode 204, a drain electrode 205, and source electrodes 203. The transistor 200 includes a native substrate 201 and an epitaxial layer 202. It is to be noted that FIG. 2 is not drawn to scale. In practice, the native substrate 201 is substantially thicker (e.g., ten times) than the epitaxial layer 202. In the example of FIG. 2, the native substrate 201 and the epitaxial layer 202 are silicon carbide of a first conductivity type. Base regions 206 of a second conductivity type (opposite the first conductivity type) are formed within the epitaxial layer 202 and are electrically coupled to corresponding base electrodes 212. Body regions 208 of the second conductivity type are also formed within the epitaxial layer 202 and are conductively coupled to corresponding base regions 206. Source regions 207 of the first conductivity type, enclosed within corresponding body regions 208, are electrically coupled to corresponding source electrodes 203.

A source region 207 forms a P-N junction with a corresponding body region 208. The transistor 200 further includes a gate oxide region 209 that partially overlaps both of the source regions 207, both of the body regions 208, and the gate electrode 204. The transistor 200 may also include buried channel regions 210 of the first conductivity type, partially overlapping the gate oxide region 209 and corresponding body regions 208.

As will be more apparent below, the transistor 200 may be fabricated while the native substrate 201 is attached to a handle substrate. The transistor 200 may be fabricated using a fabrication process that has a thermal budget of at most 1300° C. so as to preserve the integrity of the bond that adheres the handle substrate to the native substrate 201. The dopants of the first and second conductivity types (i.e., P-type/N-type dopants) implanted in the epitaxial layer 202 may be activated using a suitable low-temperature (i.e., less than 1300° C.) annealing process. An example annealing process that may be used for dopant activation is low-temperature wafer-scale microwave annealing, e.g., as described in: Yao Jen LEE, et al., "Low-temperature microwave annealing processes for future IC fabrication—A review", IEEE Transactions on electron devices, 61(3) (2014), pp. 651-665; and Yu-Lun L U, et al., "Nanoscale p-MOS thin-film transistor with TiN gate electrode fabricated by low-temperature microwave dopant activation," IEEE Electron Device Letters 31, no. 5 (2010): 437-439.

Figure 3:
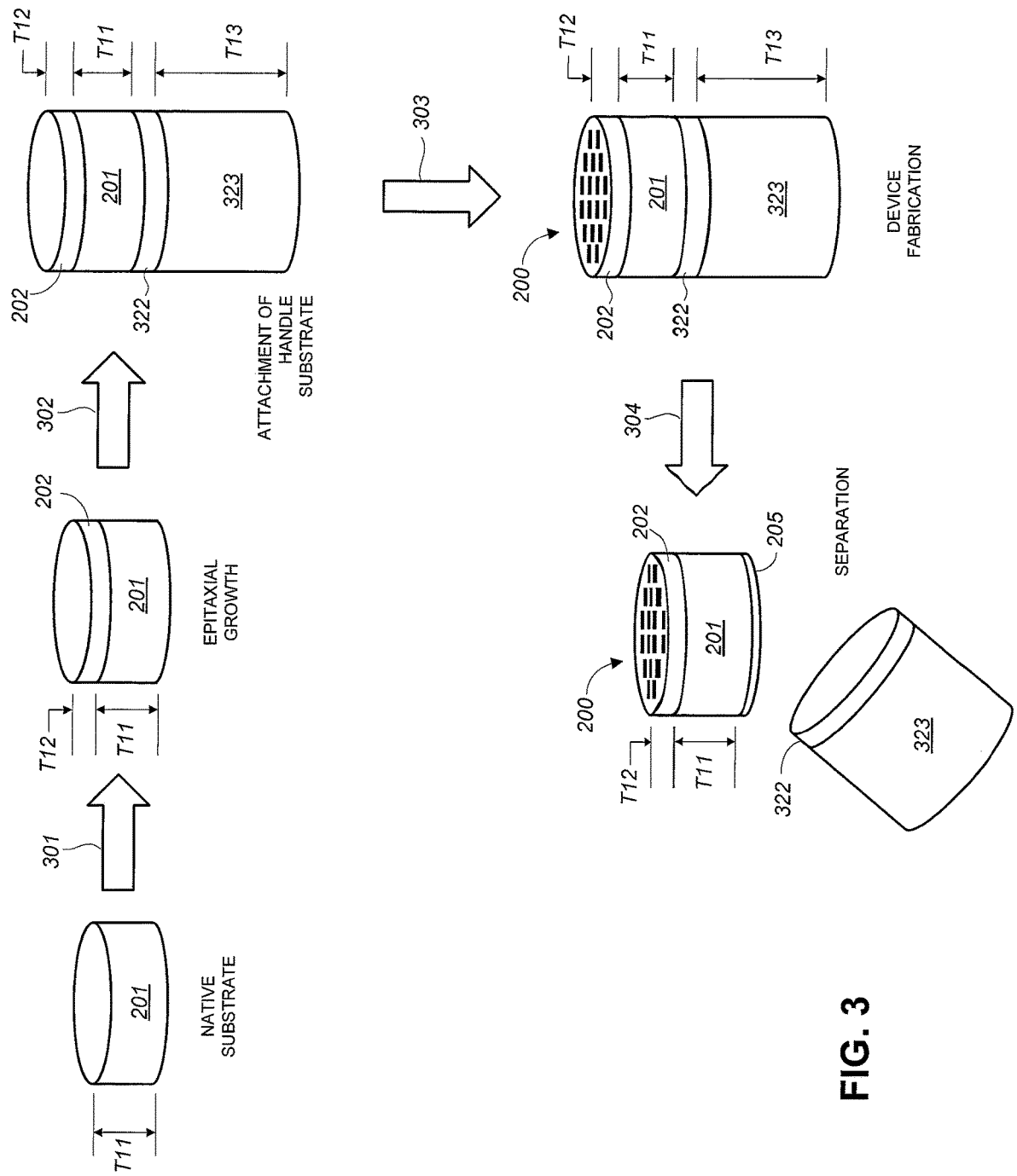
FIG. 3 is a graphical diagram that illustrates a method of fabricating a wide bandgap device in accordance with an embodiment of the present invention.

FIG. 3 is a graphical diagram that illustrates a method of fabricating a wide bandgap device in accordance with an embodiment of the present invention.

The method of FIG. 3 begins with a native substrate 201. In one embodiment, the native substrate 201 is a 4H-SiC wafer with a thickness T11 of 300 μm. An epitaxial process grows a single-crystal silicon carbide epitaxial layer 202 with a thickness T12 of 10 μm on a surface of the native substrate 201 (see arrow 301). A handle substrate 323 is thereafter attached to an opposing surface of the native substrate 201 by way of an interface layer 322 (see arrow 302). In one embodiment, the handle substrate 323 is a silicon wafer with a thickness T13 of 1 mm, and the interface layer 322 comprises silicon dioxide ($SiO_2$) with a thickness of 0.1 to 2 μm. The thickness of the interface layer 322 may vary depending on the particular interface layer employed.

An interface layer 322 may be formed on the native substrate 201, and the handle substrate 323 is thereafter bonded to the interface layer 322. Alternatively, the interface layer 322 may be formed on the handle substrate 323, and the interface layer 322 is thereafter bonded to the native substrate 201. Alternatively, an interface layer may be formed on both the native substrate 201 and the handle substrate 323, and a bond may be formed between the two interface layers (e.g., by glass-to-glass bonding). Suitable interface layers that may be used include silicon dioxide (glass), spin-on-glass, hydrogen silsesquioxane (HSQ), and conventional plasma deposited silicon dioxide. A suitable wafer bonding process, such as direct bonding or anodic bonding, may be used to attach the native substrate 201 to the handle substrate 323 with or without the use of an interface layer.

It is to be noted that the epitaxial layer 202 is grown before the handle substrate 323 is attached to the native substrate 201. Otherwise, the high temperature of the epitaxial process can break bonds that attach the handle substrate 323 to the native substrate 201.

After the handle substrate 323 has been attached to the native substrate 201, the resulting composite wafer (i.e., native substrate 201 with handle substrate 323) achieves sufficient mechanical strength to go through the device fabrication process. Wide bandgap devices are then fabricated in the epitaxial layer 202 (see arrow 303). In the example of FIG. 3, the wide bandgap devices are a plurality of transistors 200 (see FIG. 2). As can be appreciated, other wide bandgap devices may also be fabricated in the epitaxial layer 202. The device fabrication process is a low-temperature process so that bonds that attach the handle substrate 323 to the native substrate 201 remain intact during device fabrication. In one embodiment, the device fabrication process includes a low-temperature annealing process to activate dopants in the silicon carbide epitaxial layer 202.

After device fabrication, the handle substrate 323 is detached from the native substrate 201 (see arrow 304). More particularly, the interface layer 322 (and thus the handle substrate 323) is physically separated from the surface of the native substrate 201. A metallization process is thereafter performed to form metal contact layers, such as the drain electrode 205, on the surface of the native substrate 201.

Figure 4:
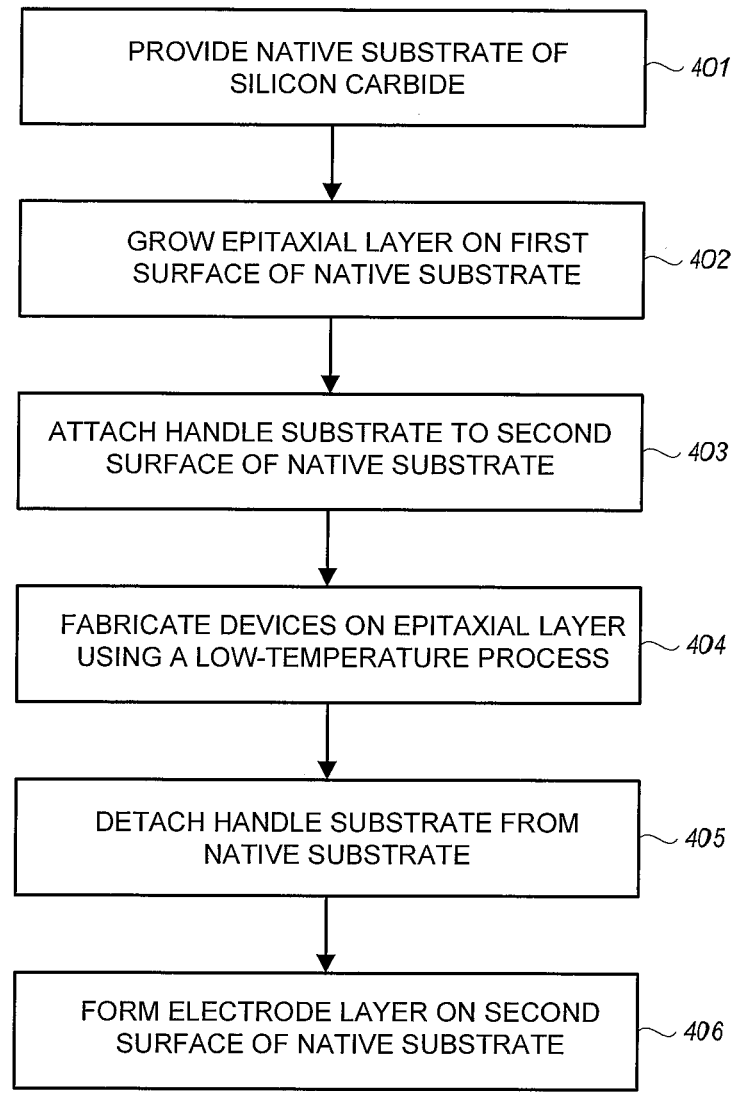
FIG. 4 is a flow diagram of a method of fabricating a wide bandgap device in accordance with an embodiment of the present invention.

FIG. 4 is a flow diagram of a method of fabricating a wide bandgap device in accordance with an embodiment of the present invention. In step 401, a native substrate of silicon carbide is provided. The native substrate may be cut from a boule of 4H-SiC. The native substrate as provided in wafer form may have a thickness in the range of 25-250 μm, e.g., 100 μm.

In step 402, a single-crystal epitaxial layer of silicon carbide is grown on a first surface of the native substrate. The epitaxial layer may be grown using a suitable epitaxial process. For example, the epitaxial layer may be grown to a thickness of 10 μm by physical vapor deposition.

In step 403, a handle substrate (e.g., silicon wafer) is attached to a second surface of the native substrate, the second surface being opposite the first surface. The handle substrate may be attached to the second surface of the native substrate by way of an interface layer. The handle substrate may also be attached directly to the native substrate, but use of the interface layer advantageously makes the attachment much easier.

In step 404, a plurality of wide bandgap vertical power devices are fabricated in the epitaxial layer using a low-temperature process. In one embodiment, the thermal budget of the fabrication process is limited to approximately 1300° C.; the fabrication process does not include any step or process that exceeds the thermal budget. In one embodiment, dopants in the epitaxial layer are activated using a low-temperature annealing process, such as low-temperature wafer-scale microwave annealing. By using microwave annealing, dopants in the epitaxial layer can be selectively activated above 85%, while maintaining the temperature on the other side (i.e., the native substrate/interface layer/handle substrate) below 1300° C., such that bonds that attach the handle substrate remain intact.

In step 405, the handle substrate, including the interface layer, is detached from the native substrate. In step 406, an electrode layer is formed on the second surface of the native substrate.

Embodiments of the present invention provide advantages heretofore unrealized. The relevant measure of merit for crystal utilization is the number of wafers harvested per boule of grown crystal (or wafers/boule). Starting with a 100 μm thick silicon carbide wafer (e.g., FIG. 3, native substrate 201 with a thickness T11) as compared to a conventional 350 μm silicon carbide wafer (e.g., FIG. 1, native substrate 301 with a thickness T1) will result in a doubling of wafers/boule. It is to be noted that wafers/boule is not directly proportional to the wafer thickness due to the kerf-loss associated with the diamond wire-saw wafering process and material lost during subsequent grind and polish.

The thinnest manufacturable native substrate starting thickness may be empirically determined and is expected to be in the range of 25-250 μm. With a 100 μm thick native wafer, a five times improvement in wafers/boule may be achieved by using zero kerf loss wafering methods, such as laser-based boule splitting. An eight times improvement in wafers/boule is achievable if the starting thickness can go as low as 50 μm. For silicon carbide, doubling of wafers/boule has a large impact on device cost just from the material saved, equivalent to the impact of two generations of device technology. There will be an equally large impact from the resulting throughput increase for substrate vendors, who will be able to service the demand with less capital deployed in crystal growers.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a wide bandgap device, the method comprising:
    providing a native substrate of silicon carbide;
    growing an epitaxial layer of silicon carbide on a first surface of the native substrate;
    after growing the epitaxial layer, attaching a handle substrate of silicon to a second surface of the native substrate, the second surface being opposite the first surface;
    fabricating a wide bandgap device in the epitaxial layer, the fabrication of the wide bandgap device having a thermal budget that does not exceed 1300° C.; and
    after fabricating the wide bandgap device, detaching the handle substrate from the native substrate.

2. The method of claim 1, further comprising:
    after detaching the handle substrate from the native substrate, forming an electrode layer on the second surface of the native substrate.

3. The method of claim 1, wherein the wide bandgap device is a vertical wide bandgap power transistor.

4. The method of claim 3, wherein dopants in the epitaxial layer are activated using an annealing process at a temperature that does not exceed the thermal budget.

5. The method of claim 4, wherein the annealing process is microwave annealing.

6. The method of claim 4, further comprising:
    after detaching the handle substrate from the native substrate, forming a drain electrode of the transistor on the second surface of the native substrate.

7. The method of claim 1, wherein the native substrate has a starting thickness in a range of 25-250 μm.

8. The method of claim 1, wherein the handle substrate is attached to the second surface of the native substrate by way of an interface layer that comprises silicon dioxide.

9. A method of fabricating a wide bandgap device, the method comprising:
    providing a native substrate of a wide bandgap material;
    growing an epitaxial layer of the wide bandgap material on a first surface of the native substrate;
    after growing the epitaxial layer, attaching a handle substrate to a second surface of the native substrate, the second surface being opposite the first surface, the handle substrate being attached to the second surface by way of an interface layer;
    fabricating a wide bandgap device on the epitaxial layer; and
    after fabricating the wide bandgap device, detaching the handle substrate from the native substrate.

10. The method of claim 9, wherein the wide bandgap material is silicon carbide.

11. The method of claim 9, wherein the wide bandgap device is fabricated with a thermal budget of at most 1300° C.

12. The method of claim 11, wherein fabricating the wide bandgap device includes activating dopants in the epitaxial layer.

13. The method of claim 9, wherein the interface layer comprises silicon dioxide.

14. The method of claim 9, wherein the handle substrate is a silicon wafer.

15. The method of claim 9, wherein the wide bandgap device is a power transistor.

16. A method of fabricating a wide bandgap device, the method comprising:
    providing a native substrate of silicon carbide;
    growing an epitaxial layer of silicon carbide on a first surface of the native substrate;
    after growing the epitaxial layer, attaching a handle substrate to a second surface of the native substrate, the second surface being opposite the first surface;
    fabricating a wide bandgap vertical power transistor in the epitaxial layer; and
    after fabricating the wide bandgap vertical power transistor, detaching the handle substrate from the native substrate.

17. The method of claim 16, wherein the handle substrate is attached to the second surface of the native substrate by way of an interface layer.

18. The method of claim 17, wherein the handle substrate is a silicon wafer.

19. The method of claim 18, wherein the interface layer comprises silicon dioxide.

20. The method of claim 16, further comprising:
after detaching the handle substrate from the native substrate, forming a drain electrode of the wide bandgap vertical power transistor on the second surface of the native substrate.

* * * * *